United States Patent
Liu et al.

(10) Patent No.: US 11,527,201 B2
(45) Date of Patent: Dec. 13, 2022

(54) DISPLAY PANEL WITH PHOTOSENSORS FOR PIXEL CALIBRATION AND METHOD OF DRIVING DISPLAY PANEL THEREWITH

(71) Applicant: BOE TECHNOLOGY GROUP CO., LTD., Beijing (CN)

(72) Inventors: Yingming Liu, Beijing (CN); Xue Dong, Beijing (CN); Haisheng Wang, Beijing (CN); Xiaoliang Ding, Beijing (CN); Changfeng Li, Beijing (CN); Wei Liu, Beijing (CN)

(73) Assignee: BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 540 days.

(21) Appl. No.: 16/344,531

(22) PCT Filed: Nov. 2, 2018

(86) PCT No.: PCT/CN2018/113625
§ 371 (c)(1),
(2) Date: Apr. 24, 2019

(87) PCT Pub. No.: WO2019/085986
PCT Pub. Date: May 9, 2019

(65) Prior Publication Data
US 2021/0335251 A1  Oct. 28, 2021

(30) Foreign Application Priority Data
Nov. 3, 2017 (CN) .......................... 201711068856.2

(51) Int. Cl.
*G09G 3/3258* (2016.01)
*H01L 27/32* (2006.01)

(52) U.S. Cl.
CPC ....... *G09G 3/3258* (2013.01); *H01L 27/3213* (2013.01); *H01L 27/3218* (2013.01);
(Continued)

(58) Field of Classification Search
CPC ....... G09G 2360/141; G09G 2360/142; G09G 2360/145; G09G 2360/148; G09G 2320/041
See application file for complete search history.

(56) References Cited

U.S. PATENT DOCUMENTS

2005/0179625 A1* 8/2005 Choi ..................... G09G 3/3233
345/76
2005/0218302 A1* 10/2005 Shin ..................... G02F 1/13318
250/214 R (Continued)

FOREIGN PATENT DOCUMENTS

CN  1734541 A  2/2006
CN  101964353 A  2/2011
(Continued)

OTHER PUBLICATIONS

Office Action dated Sep. 26, 2019, issued in counterpart CN application No. 201711068856.2, with English translation. (23 pages).

(Continued)

*Primary Examiner* — Yuzhen Shen
(74) *Attorney, Agent, or Firm* — WHDA, LLP

(57) ABSTRACT

A display panel includes a plurality of pixels arranged in an array; a plurality of first sensor units (2) in the array, each first sensor unit (2) being coupled to at least one of the plurality of pixels and being configured to detect brightness of the at least one of the plurality of pixels; and a plurality of second sensor units (3) in the array, each second sensor unit (3) being coupled to at least one of the plurality of first
(Continued)

sensor units (2) and being configured to detect a variation in at least one environmental parameter of the at least one of the plurality of pixels. Each first sensor unit (2) includes a first photo sensor (S1). Each second sensor unit (3) comprises a second photo sensor (S2) and a shielding layer on a light-receiving surface of the second photo sensor (S2).

13 Claims, 13 Drawing Sheets

(52) U.S. Cl.
CPC . *H01L 27/3227* (2013.01); *G09G 2300/0452* (2013.01); *G09G 2320/041* (2013.01); *G09G 2360/148* (2013.01)

(56) References Cited

U.S. PATENT DOCUMENTS

| | | | |
|---|---|---|---|
| 2006/0012311 A1 | 1/2006 | Ogawa | |
| 2009/0002341 A1* | 1/2009 | Saito | H01L 27/323 345/175 |
| 2009/0066897 A1* | 3/2009 | Katoh | G09G 3/3406 349/116 |
| 2009/0201228 A1* | 8/2009 | Kim | H01L 27/14692 438/479 |
| 2010/0308345 A1* | 12/2010 | Brown | H01L 31/153 250/208.2 |
| 2010/0321355 A1* | 12/2010 | Gotoh | G06F 3/0421 345/207 |
| 2011/0074750 A1* | 3/2011 | Leon | G09G 3/3233 345/207 |
| 2011/0096047 A1 | 4/2011 | Endo | |
| 2011/0242143 A1* | 10/2011 | Yamashita | G09G 3/3233 345/690 |
| 2014/0267465 A1* | 9/2014 | Yamashita | G09G 3/3225 345/690 |
| 2018/0240405 A1 | 8/2018 | Li et al. | |
| 2018/0336822 A1 | 11/2018 | Yan et al. | |

FOREIGN PATENT DOCUMENTS

| | | |
|---|---|---|
| CN | 103033262 A | 4/2013 |
| CN | 106531081 A | 3/2017 |
| CN | 106935190 A | 7/2017 |
| CN | 107785406 A | 3/2018 |

OTHER PUBLICATIONS

International Search Report dated Feb. 12, 2019, issued in counterpart application No. PCT/CN2018/113625. (11 pages).

* cited by examiner

DISPLAY PANEL WITH PHOTOSENSORS FOR PIXEL CALIBRATION AND METHOD OF DRIVING DISPLAY PANEL THEREWITH

CROSS-REFERENCE TO RELATED APPLICATIONS

This application claims the benefit of the filing date of Chinese Patent Application No. 201711068856.2 filed on Nov. 3, 2017, the entire disclosure of which is hereby incorporated by reference.

TECHNICAL FIELD

The present disclosure generally relates to the field of organic electroluminescence technology, and in particular, to an organic light emitting diode (OLED) display panel, a display device containing the display panel, and a method of driving the display panel.

BACKGROUND

Currently, the display technologies mainly include two main categories: organic light emitting diode (OLED) technology and liquid crystal display (LCD) technology. OLED display devices have numerous advantages that contribute to their popularity in the field of display technology. For example, OLED devices are self-illuminating, and are capable of wide viewing angles, flexible display, and three-dimensional (3D) display.

BRIEF SUMMARY

The present disclosure provides a display panel. The display panel may comprise a plurality of pixels arranged in an array; a plurality of first sensor units in the array, each first sensor unit being coupled to at least one of the plurality of pixels and being configured to detect brightness of the at least one of the plurality of pixels; and a plurality of second sensor units in the array, each second sensor unit being coupled to at least one of the plurality of first sensor units and being configured to detect a variation in at least one environmental parameter of the at least one of the plurality of pixels. In at least some embodiments, each first sensor unit may comprise a first photosensor. In at least some embodiments, each second sensor unit may comprise a second photosensor and a shielding layer on a light-receiving surface of the second photosensor.

In at least some embodiments, each second sensor unit may be configured to detect a variation in a temperature.

In at least some embodiments, each second sensor unit may be further configured to convert the detected variation into a second signal, and each first sensor unit may be further configured to convert the detected brightness into a first signal, and to correct the first signal for the detected variation based on the second signal.

In at least some embodiments, each first sensor unit may be coupled to a single pixel.

In at least some embodiments, each first sensor unit may be coupled to a plurality of pixels.

In at least some embodiments, each second sensor unit may be coupled to a single first sensor unit, and an area of the light-receiving surface of the second photosensor of each second sensor unit may be substantially equal to an area of a light-receiving surface of the first photosensor of each of the plurality of first sensor units.

In at least some embodiments, each second sensor unit may be coupled to a plurality of first sensor units, and an area of the light-receiving surface of the second photosensor of each second sensor unit may be larger than an area of a light-receiving surface of the first photosensor of each of the plurality of first sensor units.

In at least some embodiments, each second sensor unit may be adjacent to at least one first sensor unit in the array.

In at least some embodiments, each second sensor unit and the adjacent at least one first sensor unit may be provided between adjacent rows of pixels in the array.

The present disclosure also provides a display device. The display device may comprise a display panel as described above.

The present disclosure also provides a method of driving the display panel. The display panel may be as described above. The method may comprise acquiring a first signal from the first sensor unit, the first signal corresponding to the detected brightness of the at least one pixel coupled to the first sensor unit; acquiring a second signal from the second sensor unit coupled to the first sensor unit, the second signal corresponding to the detected variation in at least one environmental parameter of the at least one of the plurality of pixels; determining an operating target brightness for the at least one pixel based on the second signal; and adjusting a driving voltage to be applied for driving the at least one pixel in accordance with the determined operating target brightness.

In at least some embodiments, if the detected brightness is less than the determined operating target brightness, the driving voltage may be increased. If the detected brightness is equal to the determined operating target brightness, the driving voltage may be maintained.

In at least some embodiments, the method may comprise acquiring a first signal from the first sensor unit, the first signal corresponding to the detected brightness of the at least one pixel coupled to the first sensor unit; acquiring a second signal from the second sensor unit coupled to the first sensor unit, the second signal corresponding to the detected variation in at least one environmental parameter of the at least one of the plurality of pixels; calculating a difference between the first signal and the second signal to obtain a correction factor; correcting the first signal by the correction factor; and adjusting a driving voltage to be applied for driving the at least one pixel in accordance with the corrected first signal and a predetermined operating target brightness for the at least one pixel.

In at least some embodiments, if the corrected first signal is less than the predetermined operating target brightness, the driving voltage may be increased. If the corrected first signal is higher than the predetermined operating target brightness, the driving voltage may be lowered. If the corrected first signal is equal to the predetermined operating target brightness, the driving voltage may be maintained.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the present disclosure are apparent from the following detailed description taken in conjunction with the accompanying drawings in which:

Figure 1:
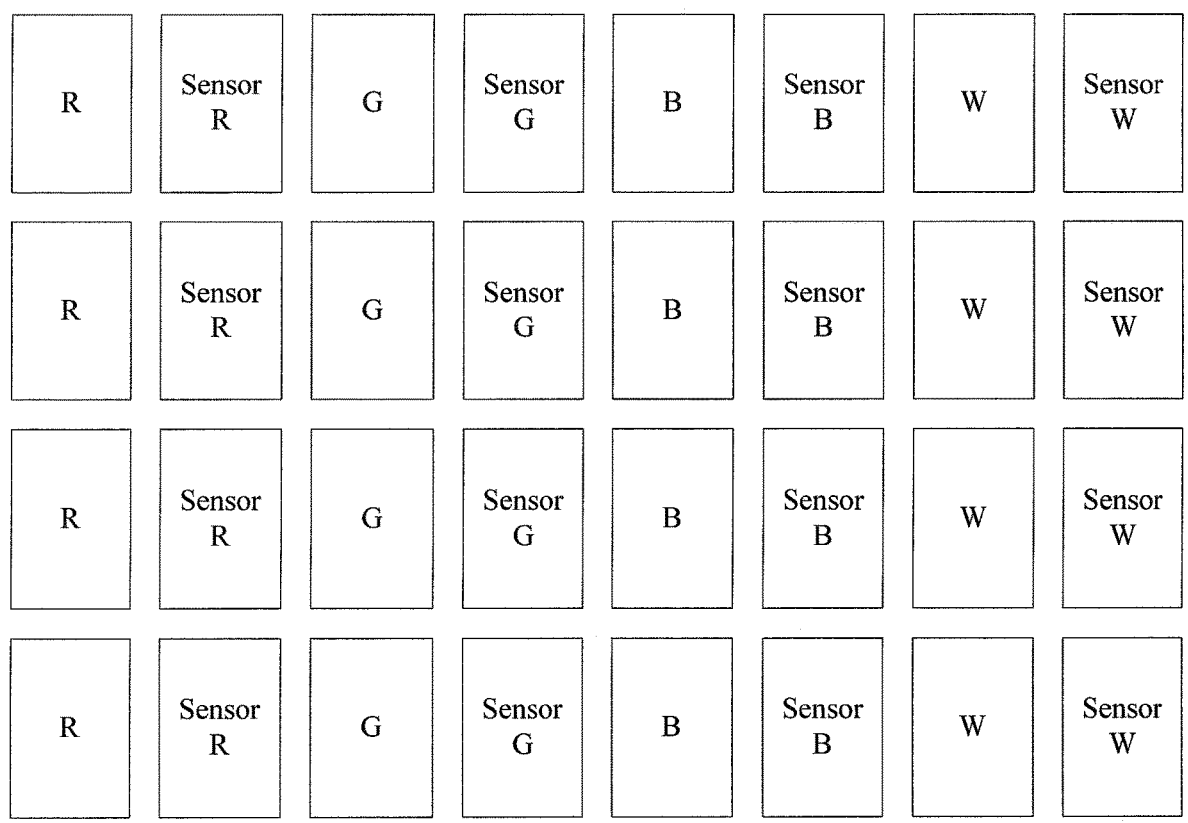
FIG. 1 shows a configuration of conventional display panel.

The various features of the drawings are not to scale as the illustrations are for clarity in facilitating one skilled in the art in understanding the invention in conjunction with the detailed description.

DETAILED DESCRIPTION

Next, the embodiments of the present disclosure will be described clearly and concretely in conjunction with the accompanying drawings, which are described briefly above. The subject matter of the present disclosure is described with specificity to meet statutory requirements. However, the description itself is not intended to limit the scope of this disclosure. Rather, the inventors contemplate that the claimed subject matter might also be embodied in other ways, to include different steps or elements similar to the ones described in this document, in conjunction with other present or future technologies.

While the present technology has been described in connection with the embodiments of the various figures, it is to be understood that other similar embodiments may be used or modifications and additions may be made to the described embodiments for performing the same function as the present technology without deviating therefrom. Therefore, the present technology should not be limited to any single embodiment, but rather should be construed in breadth and scope in accordance with the appended claims. In addition, all other embodiments obtained by one of ordinary skill in the art based on embodiments described in this document are considered to be within the scope of this disclosure.

Conventional organic light emitting diode (OLED) display devices often suffer from issues affecting stability and/or uniformity of display. As the size of the display device grows, defects in display can become more noticeable. Thin film transistors (TFT) commonly implemented in display devices, including OLED devices. Several TFTs are usually implemented to drive the pixel circuit. There is considerable interest in adopting, for OLED, TFTs containing oxide semiconductors as active layers, because such oxide TFTs have shown remarkable performance, including low-temperature fabrication, high transparency, and excellent electrical properties. However, oxide TFTs can also be inherently unstable, which can further exacerbate instability and/or non-uniformity of the display device. More particularly, performance of oxide TFTs often degrade during its lifetime as a result of various stresses. Threshold voltage (Vth) and charge mobility (Mob) in an oxide TFT undergo shifts during the lifetime of the oxide TFT. As a result, the oxide TFT may not reliably generate the desired current flow under the same standard voltage. This in turn makes it difficult to generate a display with the desired gray level, and reduces the overall brightness uniformity of the display. Instability of the oxide TFT can ultimately cause deterioration in the display quality of the display device over time.

To address the issues afflicting the oxide TFT, a compensation circuit has been proposed. A compensation circuit is configured to compensate the threshold voltage and mobility variations in an oxide TFT. However, a compensation circuit can only compensate for the performance of the thin film transistor tube, and cannot compensate for shifts and fluctuations in other aspects of the OLED device, for example, in the electroluminescent (EL) material of the OLED device due to aging. As a result, even with a compensation circuit, the display quality of the OLED device may still deteriorate over time.

FIG. 1 shows a conventional display panel. As shown in FIG. 1, a photosensor (Sensor R, Sensor G, Sensor B, Sensor W) is paired with a sub-pixel (R, G, B, W). The photosensor may contain a photosensitive TFT that monitors the brightness (luminance) of each sub-pixel (R, G, B, W), and apply compensation as appropriate. Each photosensor is calibrated according to the sub-pixel with which the photosensor is paired and which is being monitored by the photosensor. The calibration is done on the basis of a photocurrent that is detectable by the photosensor and that corresponds to a target value along the characteristic gamma curve for the sub-pixel to be monitored. When a display device generates a display, a nonlinear relationship exists between the input voltage applied to a sub-pixel and the brightness of the sub-pixel. This nonlinear relationship is represented by what is commonly known as the gamma curve. Each target gamma value corresponds to a grayscale. Further, since the magnitude of photocurrent is proportional to brightness (luminance), the photocurrent measurement can be used to determine brightness. The calibration process yields a normalized brightness value A for each photosensor. Each shift in the brightness of the photosensor from 0 to 255 grayscale has a corresponding brightness value.

Figure 2:
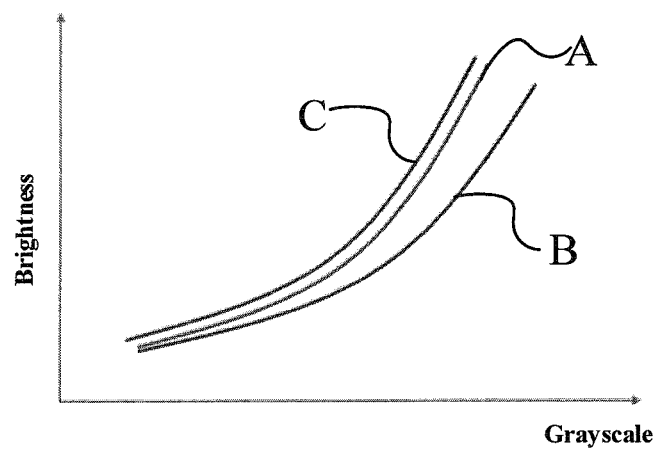
FIG. 2 shows a plot of grayscale of a sub-pixel and brightness of the sub-pixel, and comparing actual brightness (B, C) of a sub-pixel in a conventional display panel to target brightness (A)

Next, the brightness of each sub-pixel is monitored by a corresponding photosensor. The photosensor obtains a measurement of the actual brightness of the sub-pixel, and determines whether the measured brightness meets the target brightness. If the measured brightness meets the target brightness, then the input voltage being applied to the sub-pixel does not need to be adjusted. On the other hand, if the measured brightness does not meet the target brightness, then the input voltage is adjusted. If the measured brightness is greater than the target brightness, then the input voltage being applied to the sub-pixel is lowered. FIG. 2 shows a plot of brightness (on the y-axis) of a sub-pixel versus grayscale of the sub-pixel (on the x-axis). Curve A represents the target brightness value. Curve B represents a sub-pixel having an actual measured brightness that is lower than the target brightness. Curve C represents a sub-pixel having an actual measured brightness that is higher than the target brightness. Once the input voltage to the sub-pixel has been adjusted, the photosensor takes a second measurement of the brightness of the sub-pixel, and compares the measurement against the target brightness. The compensation is repeated as necessary, so that the difference between the target brightness and the actual brightness of each sub-pixel is as small as possible. In turn, the quality of the display generated by the display device can be maintained.

Figure 3:
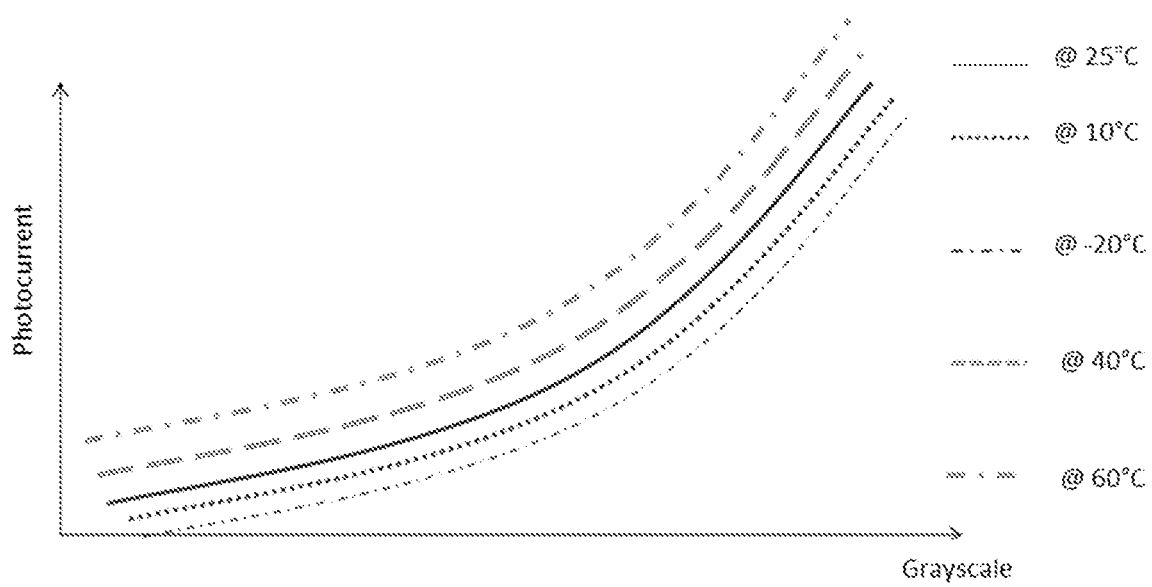
FIG. 3 shows a curve illustrating temperature-dependent effect on the photocurrent versus grayscale plot of a photosensor for a conventional display panel.

Commonly used photosensors adopt PIN photodiode or TFT. However, both PIN photodiode and TFT contain a semiconductor component, the properties of which may be susceptible to changes due to environmental influences (for example, operating temperature). The semiconductor component may also respond differently to light intensity. FIG. 3 illustrates temperature-dependent changes in the target brightness of a photosensor for a conventional display panel. As shown in FIG. 3, increasing temperature can shift the calibration curve, and therefore the target brightness, of a semiconductor-containing photosensor upward, while decreasing temperature can shift the calibration curve downward. These shifts can introduce inaccuracies and imprecision in the control of a display.

The present disclosure provides a display panel. As shown in FIGS. 4 to 7, the display panel comprises a pixel array, which comprises a plurality of sub-pixels 1. The design, construction, and structure of the sub-pixel 1 are not particularly limited. The sub-pixel 1 may be formed according to any appropriate means known to a person of ordinary skill in the art depending on intended purposes.

Each sub-pixel 1 is paired with a first sensor unit 2. In some embodiments, the first sensor unit 2 may be coupled (for example, electrically connected) to the corresponding sub-pixel 1. In some embodiments, the first sensor unit 2 may be independent from the corresponding sub-pixel 2. Each first sensor unit 2 includes a first photosensor S1. The first sensor unit 2 is configured to monitor at least one of the plurality of sub-pixels 1, and more particularly, the first sensor unit 2 is configured to detect the brightness of at least one of the plurality of sub-pixels 1, and to control the driving voltage for driving the at least one of the plurality of sub-pixels 1 according to the detected brightness of the at least one of the plurality of sub-pixels 1. In the embodiment illustrated in FIG. 4, the first sensor unit 2 is configured to control a set of sub-pixels (a group of sub-pixels R, G, B, and W) 1. In the embodiment illustrated in FIG. 5, the first sensor unit 2 is configured to control a single sub-pixel (R, G, B, or W), that is, an one-to-one correspondence.

Each first sensor unit 2 is paired with a second sensor unit 3. The second sensor unit 3 is configured to detect variations in the external environment that are not caused by variations in ambient light. The detected variations are then used to determine a correction factor for correcting the detected brightness of the sub-pixel 1 by the first sensor unit 2, in order to remove distortions and/or noises in the detected brightness that are caused by environmental variations unrelated to changes in ambient light. In some embodiments, the second sensor unit 3 may comprise a temperature sensing component configured to detect temperature variations in the external environment of the corresponding first photosensor(s) S1. Each second sensor unit 3 includes a second photosensor S2. The second photosensor S2 is configured to detect variations in the external environment, and then convert the detected variations into second signals.

The light-receiving surface of the second photosensor S2 is shielded. More particularly, a shielding layer may be disposed on the light-receiving surface of the second photosensor S2 of the second sensor unit 3. The shielding layer may be composed of metal or a black matrix (shown in solid black in FIG. 8). In some embodiments, the shielding layer is in contact with the light-receiving surface of the second photosensor S2, and may be provided directly on the light-receiving surface of the second photosensor S2. In some embodiments, depending on the specifications of the fabrication process, a space may be provided between the shielding layer and the light-receiving surface of the second photosensor S2. The shielding layer may be formed by any appropriate means known to a person of ordinary skill in the art. For example, the shielding layer may be formed as a separate layer in the second photosensor S2, or as a part of an existing structure of the second photosensor S2. In the embodiment shown in FIG. 8, the shielding layer is formed as a separate layer.

The first photosensor S1 and the second photosensor S2 may be formed and configured according to any appropriate means known to a person of ordinary skill in the art, including, for example, by adopting photosensitive TFT technology, PIN photodiode technology, and the like. It is also understood that additional components and/or accessories may be provided in the photosensor S1, S2 of the present disclosure without departing from the spirit and scope of the present disclosure. A person of ordinary skill in the art would readily appreciate that the configuration of the photosensor S1, S2 is not limited to the embodiments described in this present disclosure or shown in the figures, and a photosensor S1, S2 may include any additional components that are typically found in a photosensor and/or that are provided according to any particular purpose for which the photosensor is intended.

The first photosensor S1 in the first sensor unit 2 is configured to detect the brightness of the corresponding sub-pixel 1, perform photoelectric conversion, and generate first signals corresponding to the detected brightness of the sub-pixel 1. However, the detected brightness, and therefore the first signals generated by the first photosensor S1, may be distorted by environmental variations (for example, temperature fluctuations). The display panel therefore comprises the second sensor unit 3, and the light-receiving surface of the second photosensor S2 of the second sensor unit 3 is shielded. The second photosensor S2 is configured to detect variations in the external environment that are not caused by variations in ambient light, and then convert the detected variations into second signals. The second signals define a correction factor for correcting the detected brightness of the sub-pixel 1 by the first photosensor S1, in order to remove distortions and/or noises in the detected brightness that are caused by environmental variations unrelated to changes in ambient light. Changes in ambient light will not be included in the signals generated by the second photosensor S2.

There are no particular limitations on the form of the first signals generated by the first sensor unit and the second signals generated by the second sensor unit 3. The first and second signals may be configured in any appropriate manner known to a person of ordinary skill in the art to encode data of interest, including, for example, a current signal, a voltage signal, or the like.

The second signals define a correction factor to be applied to the first signals generated by the first photosensor S1, so as to remove from the first signals distortions and/or noises due to environmental factors. Based on the corrected first signals and the predetermined target brightness value, the driving voltage for driving the sub-pixel 1 is controlled. In some embodiments, the second signals generated by the second photosensor 2 may be used to determine, in real time, an operating target brightness value in accordance with the conditions of the external environment. Then, based on the determined target brightness value and the first signals generated by the first photosensor S1, the driving voltage for driving the sub-pixel 1 is controlled. The present disclosure thus makes it possible to remove interferences and distortions in the measurements of the first photosensor S1 that are caused by environmental variations, which in turn allows for the continuous and accurate monitoring, and dynamic control, of the display by the photosensor.

Figure 4:
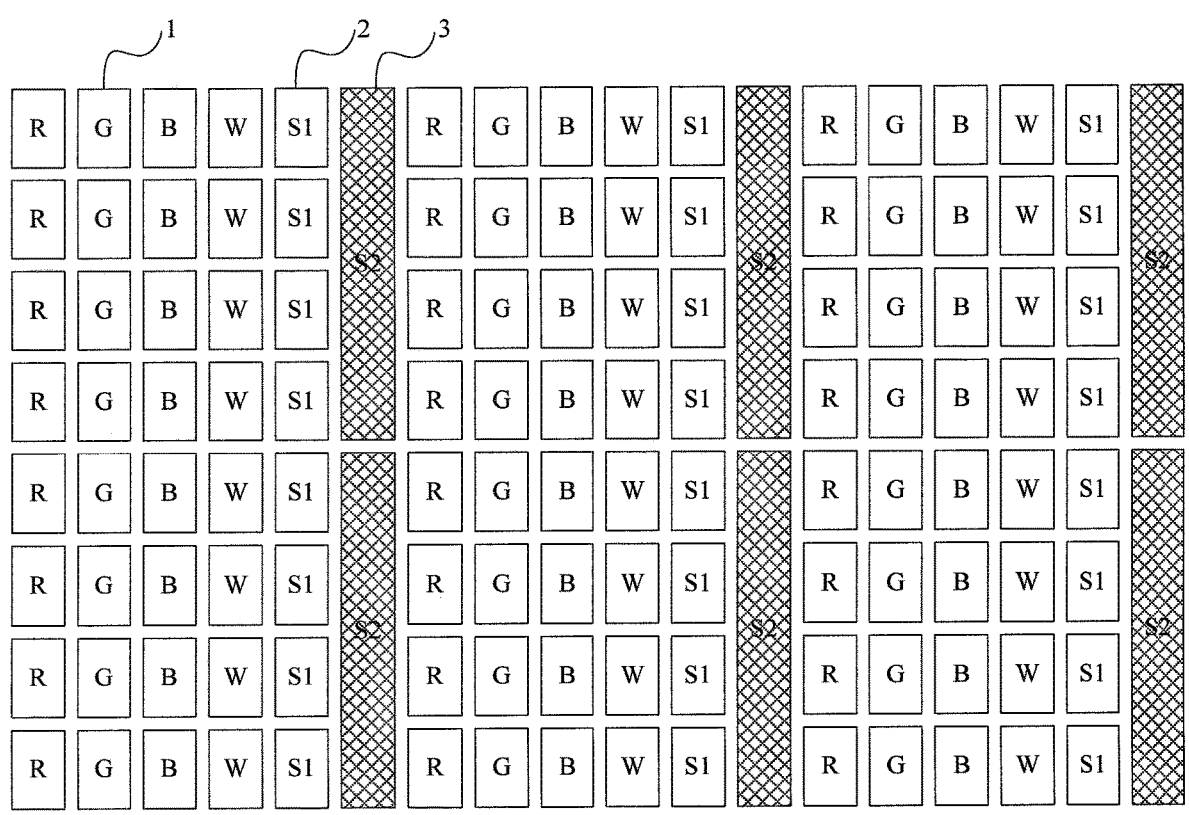
FIGS. 4 to 7 show schematic diagrams of display panels according to embodiments of the present disclosure.
Figure 5:
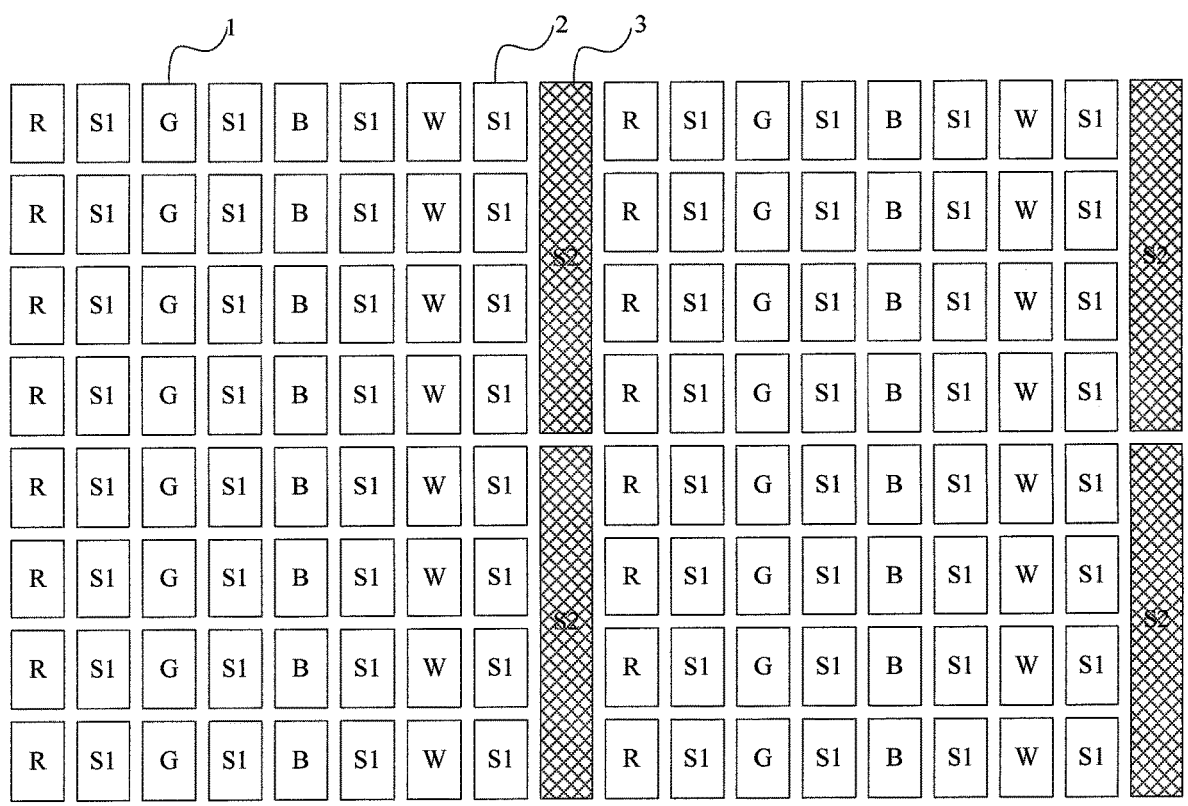

As shown in FIGS. 4 and 5, one second sensor unit 3 may be provided for a plurality of first sensor units 2, for example, corresponding to the number of first sensor units 2 in a predetermined area of the array substrate of the display panel. When one second sensor unit 3 is provided for more than one first sensor unit 2, the number of second sensor units 3 needed for a display panel may be relatively small. In some embodiments, the second sensor unit 3 may comprises a temperature sensing component configured to detect temperature variations in the external environment of the corresponding first photosensor(s) S1, and determine, in real time, an operating target brightness value for each corresponding first photosensor S1.

As shown in FIGS. 4 and 5, the area of the light-receiving surface of the second photosensor S1 of the second sensor unit 3 is greater than the area of the light-receiving surface of the first photosensor S1 of the first sensor unit 2.

In embodiments where one second sensor unit 3 is provided for a plurality of first sensor units 2, in order to accurately monitor the environments of the first sensor units 2 (including any variations in any of the environment variables, such as temperature), the second sensor unit 3 needs to be in sufficiently close proximity of each corresponding first sensor unit 2. Configuring the second sensor unit 3 to have a larger light-receiving surface than that of the first sensor unit 2 helps ensure that the second sensor unit 3 is sufficiently close to each corresponding first sensor unit 2.

In some embodiments, for example, where one second sensor unit 3 is provided for a single first sensor unit 2, the area of the light-receiving surface of the second sensor unit 3 is substantially equal to or smaller than the area of the light-receiving surface of the first sensor unit 2. In other words, the geometry and dimension of the light-receiving surface of the second sensor unit 3 may be configured in any appropriate manner known to a person of ordinary skill in the art according to any particular purpose for which the second sensor unit 3 is intended.

Figure 6:
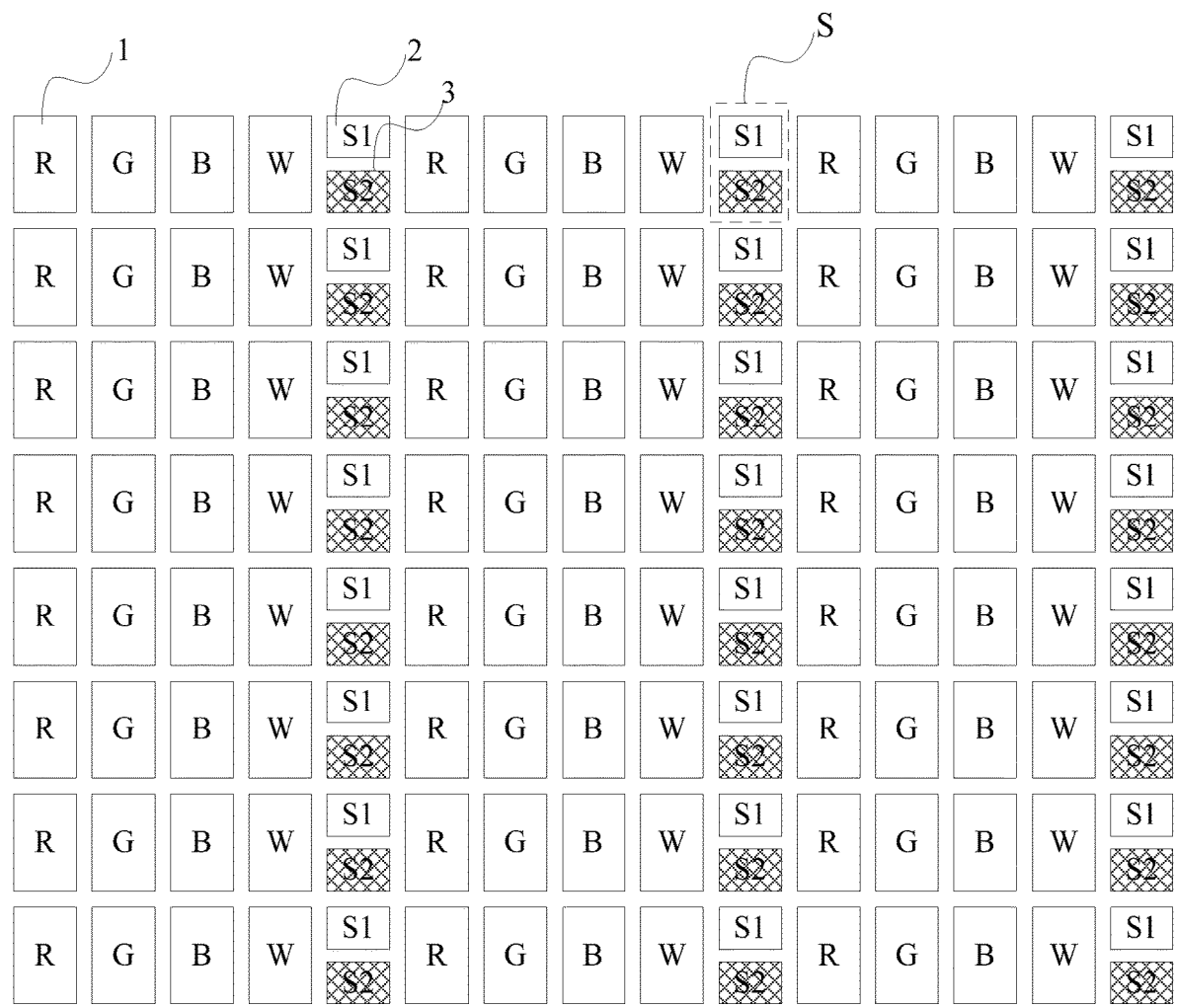
Figure 7:
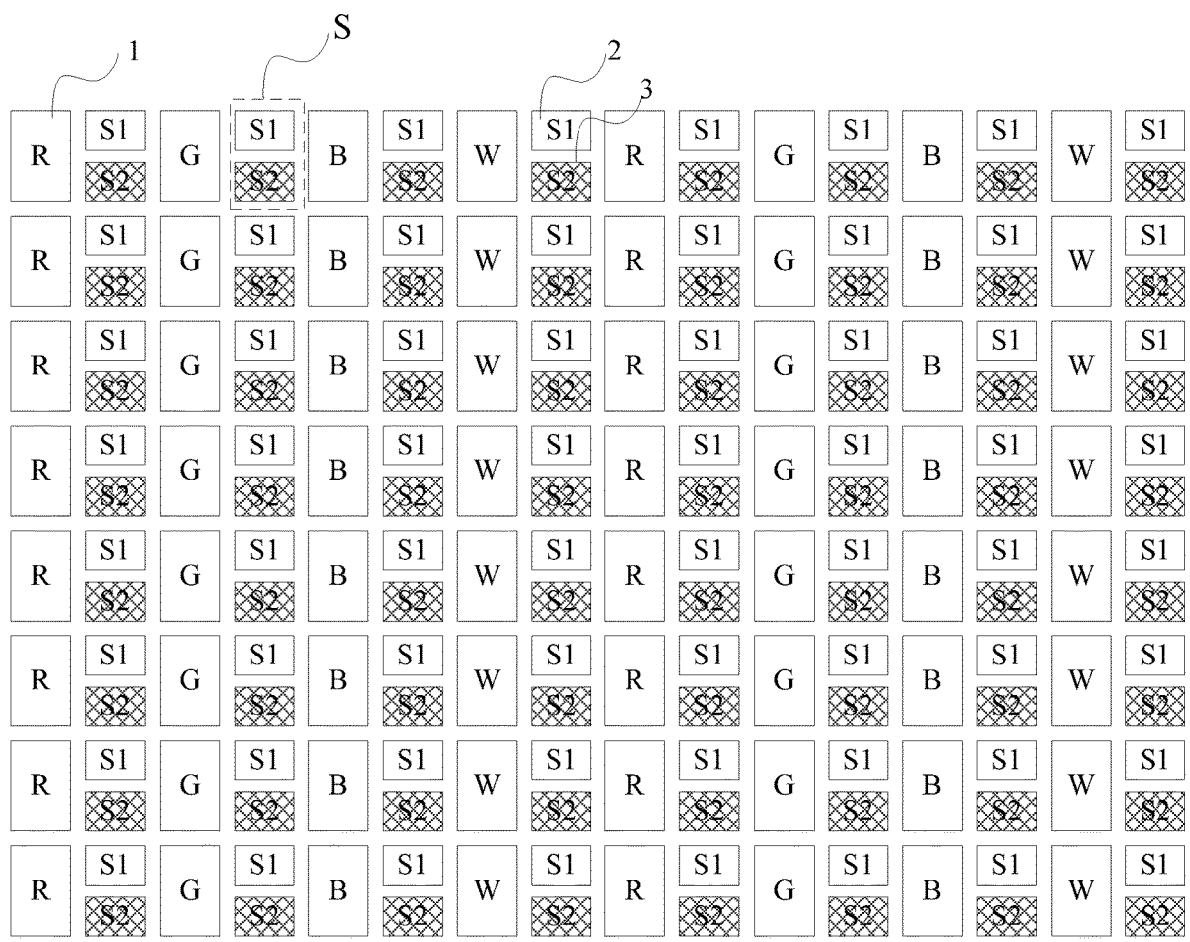

As shown in FIGS. 6 and 7, a second sensor unit 3 may be provided to monitor a single first sensor unit 2, that is, an one-to-one correspondence between the second sensor unit 3 and the first sensor unit 2. This configuration may increase the accuracy and precision of the monitoring by the second sensor unit 3. In these embodiments, the second photosensor 2 in the second sensor unit 3 may be configured as a control unit to detect environmental variations other than changes in ambient light (for example, temperature variations), which may create distortions/noises in the first signals generated by the first photosensor 1, and to generate second signals corresponding to the detected variations. The second signals are then used to correct the first signals to remove the effects of the environmental variations from the first signals.

As shown in FIGS. 6 and 7, each second sensor unit 3 is disposed adjacent to the corresponding first sensor unit 3, so as to form a sensor unit pair S. In each sensor unit pair S, the area of the light-receiving surface of the first photosensor S1 is substantially equal to the area of the light-receiving surface of the second photosensor S2. In embodiments with one-to-one pairing of the second sensor unit 3 and the first sensor unit 2, maintaining near identity between the geometry and dimensions of the first and second photo sensors S1, S2, which effectively limits the monitoring area of the second photosensor S2 to the first photosensor S1, helps improve the accuracy and precision of the environment monitoring by the second photosensor S2.

As shown in FIGS. 5 and 7, each first sensor unit 2 may be configured to monitor one sub-pixel 1, that is, a one-to-one correspondence between the first sensor unit 2 and the sub-pixel 1. The first sensor unit 2 is disposed adjacent to the corresponding sub-pixel 1. In other embodiments, each first sensor unit 2 may be configured to monitor a plurality of sub-pixels 1. For example, as shown in FIGS. 4 and 6, a first sensor unit 2 is configured to monitor a set of sub-pixels 1 comprising one red sub-pixel R, the green sub-pixel G, one blue sub-pixel B, and one white sub-pixel W. However, the combination of sub-pixels 1 that may be controlled by a single first sensor unit 2 is not particularly limited, and the first sensor unit 2 may be configured to control a combination of sub-pixels 1 as desired according to intended use.

As shown in FIGS. 4 to 7, the first sensor unit 2 and the second sensor unit 3 may be disposed between adjacent rows of sub-pixels 1. With this configuration, when a row of sub-pixels 1 are being illuminated, the first sensor unit 2 and the second sensor unit 3 are located in the same row as the corresponding sub-pixel(s) 1, so as to be in close proximity to the corresponding sub-pixel(s) 1. Close proximity can facilitate the transmission of signals.

Figure 8:
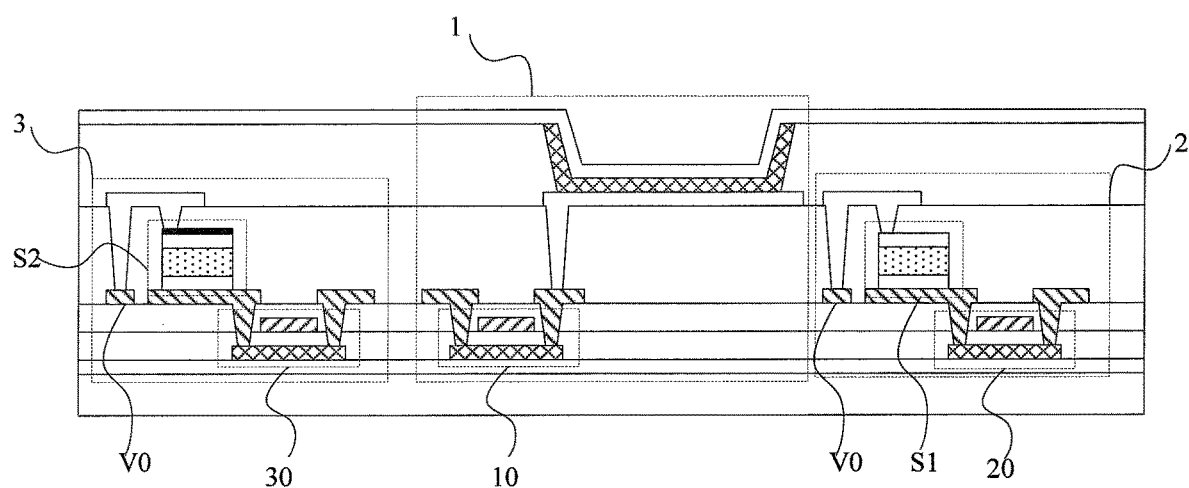
FIG. 8 shows a schematic diagram of a cross-section of a display panel according to an embodiment of the present disclosure.
Figure 9:
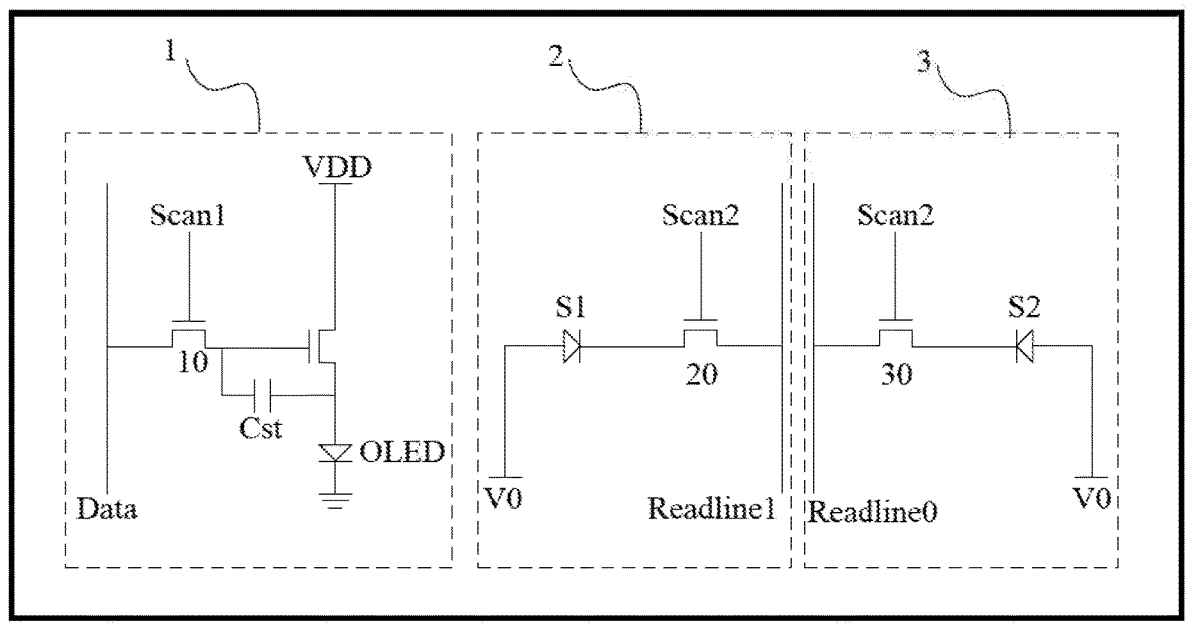
FIG. 9 shows a schematic circuit diagram of a display panel according to an embodiment of the present disclosure.

As shown in FIGS. 8 and 9, a first end of the first photosensor S1 of the first sensor unit 2 is connected to a fixed signal terminal V0. A second end of the first photosensor S1 is connected to a signal read line (for example, Readline0, Readline1 in FIG. 9) through the first switch transistor 20 in the first sensor unit 2. Similarly, a first end of the second photosensor S2 of the second sensor unit 3 is connected to a fixed signal terminal V0. A second end of the second photosensor S2 is connected to a signal read line (Readline0, Readline) through the second switch transistor 30 in the second sensor unit 3.

Switch transistors 20, 30 as well as the drive transistor 10 in the sub-pixel 1, may be bottom-gate or top-gate transistors. The configurations of the transistors 10, 20, 30 are not particularly limited, and may be configured in any manner known to a person of ordinary skill in the art without departing from the spirit and scope of the present disclosure. A person of ordinary skill in the art would readily appreciate that the configurations of the transistors 10, 20, 30 are not limited to the embodiments described in this present disclosure or shown in the figures, and each of the transistors 10, 20, 30 may include any components that are typically found in a switch transistor and/or a drive transistor, and/or that are provided according to any particular purpose for which each thin film transistor is intended.

As shown in FIG. 8, a shielding layer may be disposed on the light-receiving surface of the second photosensor S2 of the second sensor unit 3. The shielding layer may be composed of metal or a black matrix (shown in solid black in FIG. 8). In some embodiments, the shielding layer is in contact with the light-receiving surface of the second photosensor S2, and may be provided directly on the light-receiving surface of the second photosensor S2. In some embodiments, depending on the specifications of the fabrication process, a space may be provided between the shielding layer and the light-receiving surface of the second photosensor S2. The shielding layer may be formed according to any appropriate means known to a person of ordinary skill in the art. For example, the shielding layer may be formed as a separate layer in the second photosensor S2, or as a part of an existing structure of the second photosensor S2. In the embodiment shown in FIG. 8, the shielding layer is formed as a separate layer.

The present disclosure provides a display device. The display device includes a display panel as described above. The display panel according to the present disclosure may be integrated into any display device, including, but not limited to, a mobile phone, a tablet, a television, a computer, a display, a notebook computer, a digital photo frame, a navigation system, and any other products or components that provide a display function.

The present disclosure provides a method of driving a display panel as described above. The basic principles of driving the display panel are as described above. More particularly, the first photosensor S1 is configured to continuously detect the brightness of light emitted by the corresponding sub-pixel 1, perform photoelectric conversion, and generate first signals corresponding to the brightness of the sub-pixel 1. However, the detected brightness, and therefore the first signals generated by the first photosensor S1, may be distorted by environmental variations (for example, temperature fluctuations). The second photosensor S2 in the second sensor unit 3 is configured to detect variations in the external environment that are not caused by variations in ambient light, and then convert the detected variations into second signals. The second signals define a correction factor for correcting the detected brightness of the sub-pixel 1 by the first photosensor S1, in order to remove distortions and/or noises in the detected brightness that are caused by environmental variations unrelated to changes in ambient light. The second signals S2 define a correction factor to be applied to the first signals generated by the first photosensor S1, so as to remove from the first signals distortions and/or noises due to environmental variations. Based on the corrected first signals and the predetermined target brightness value, the driving voltage for driving the sub-pixel 1 is adjusted. In some embodiments, the second signals generated by the second photosensor 2 may be used to determine, in real time, an operating target brightness value in accordance with the conditions of the environment. Then, based on the determined target brightness value and the first signals generated by the first photosensor S1, the driving voltage for driving the sub-pixel 1 is adjusted. The present disclosure thus makes it possible to dynamically correct for interferences and distortions in the measurements from the first photosensor S1 that are caused by environmental variations, which in turn allows for the continuous and accurate monitoring and adjustment of the display by the photosensor.

Figure 10:
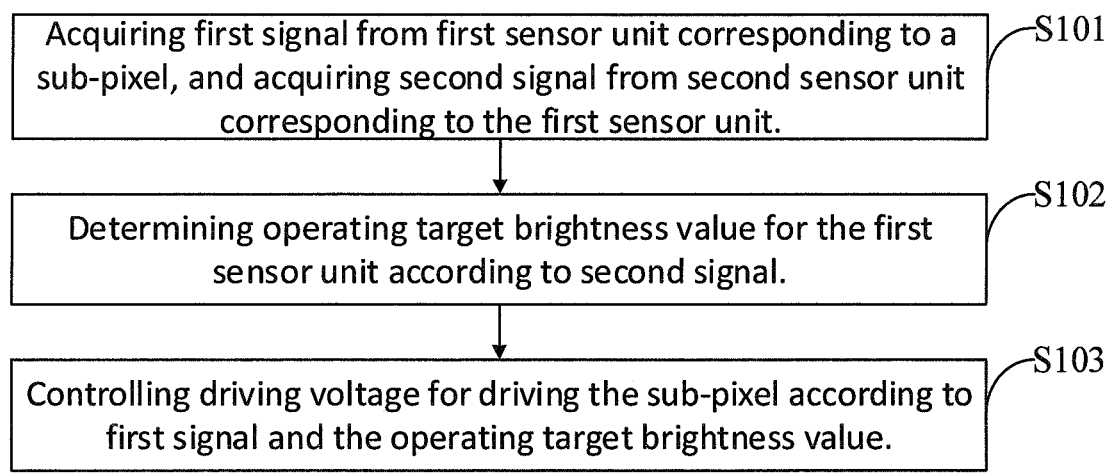
FIG. 10 shows a flow chart of a method of driving a display panel according to an embodiment of the present disclosure.

As shown in FIG. 10, in step 101 (S101), the first signals generated by the first photosensor S1 of the first sensor unit 2 are received, and the second signals generated by the second photosensor S2 of the corresponding second sensor unit 3 are received.

In step 102 (S102), based on the second signals, an operating target brightness value is determined for the first sensor unit 2.

In step 103 (S103), based on the first signals and the operating target brightness value, the driving voltage for driving the sub-pixel 1 corresponding to the first sensor unit 2 and the second sensor unit 3 is controlled.

The method of driving a display panel described above may be implemented in an embodiment where one second sensor unit 3 is provided for a plurality of first sensor units 2, or in an embodiment where a single second sensor unit 3 is provided for a single first sensor unit 2.

When the sub-pixels are being illuminated row-by-row in between displays, step 101 (S101) may be performed concurrently as the illumination of the sub-pixels to acquire first signals from the first sensor units corresponding to each sub-pixel and second signals from the second sensor units corresponding to each sub-pixel. However, the timing of step 101 (S101) is not particularly limited, and may be configured in any appropriate manner known to a person of ordinary skill in the art according to intended purposes. For example, in some embodiments, step 101 (S101) may be performed during display, rather than in between displays.

As described above, in step 102 (S102), based on the second signals from the second sensor unit 3, an operating target brightness value for the sub-pixel is determined and transmitted to the first sensor unit 2. In some embodiments, the second sensor unit 3 may be configured with a predetermined correspondence between a value of a particular environmental factor (for example, temperature) and the particular data encoded in the second signals, and a predetermined correspondence between a measurement for the particular environmental factor and target brightness. Based on the predetermined correspondence between the particular environmental factor and second signals, a value for the particular environmental factor specifically corresponding to the second signals as acquired from the second sensor unit 3 could be determined. Then, the value for the particular environmental factor could be used to determine the operating target brightness value for the first sensor unit 2 in accordance with the predetermined correspondence between the measurement of the particular environmental factor and target brightness.

For example, FIG. 3 shows temperature-dependent changes in the current-grayscale curve of a photosensor. As shown in FIG. 3, increasing temperature can shift the current-grayscale curve of a semiconductor-containing photosensor upward, and the target brightness is correspondingly shifted upward. Conversely, decreasing temperature can shift the current-grayscale curve downward, so that the target brightness is correspondingly shifted downward. Further, each temperature value corresponds to a different target brightness value. If the environmental variable being monitored by the second sensor unit is temperature, and a specific temperature is determined based on the second signals from the second sensor unit, then the specific temperature could be used to determine the proper target brightness for the corresponding first sensor unit. As temperature changes, the target brightness for the first sensor unit will also change. In this way, the present disclosure makes it possible to continuously monitor the environment surrounding the first sensor unit and the sub-pixels, and to dynamically and automatically adjust the target brightness value for the first sensor unit and the driving voltage being applied to the sub-pixels, so as to maintain the quality of the display.

In some embodiments, the correspondence between a given value of the second signal from the second sensor unit and the target brightness for the first sensor unit may be predetermined. Then, the target brightness may be derived directly from the second signal, in contrast to embodiments where the target brightness is determined based on the environment variable being monitored.

As described above, in step 103 (S103), based on the first signals and the operating target brightness value, the driving voltage for driving the sub-pixel 1 corresponding to the first sensor unit 2 and the second sensor unit 3 is adjusted. More particularly, when the brightness of a sub-pixel as determined based on the first signals from the corresponding first sensor unit exceeds the target brightness determined for the first sensor unit, the driving voltage applied to the sub-pixel is reduced. When the brightness of the sub-pixel is less than the target brightness, the driving voltage is increased. When the brightness of the sub-pixel is equal to the target brightness, no adjustments are made to the driving voltage.

There are no particular limitations on the form of the first signals generated by the first sensor unit and the second signals generated by the second sensor unit. The first and second signals may be configured in any appropriate manner known to a person of ordinary skill in the art to encode data of interest, including, for example, a current signal, a voltage signal, or the like.

Figure 11:
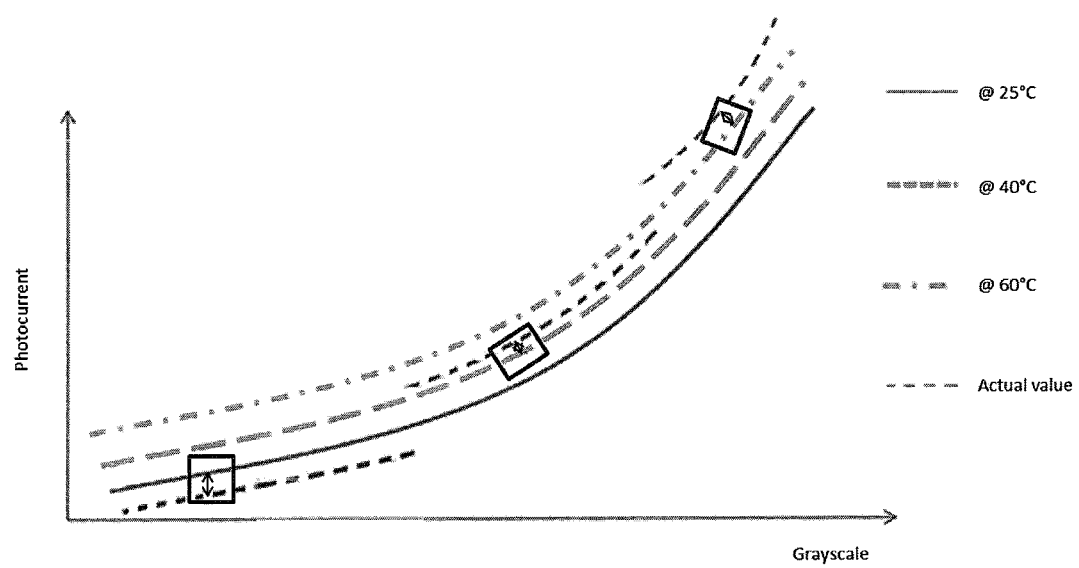
FIG. 11 shows a curve illustrating a functional relationship between grayscale and brightness in a display panel according to the embodiment illustrated in FIG. 10.

FIG. 11 shows a curve illustrating a functional relationship between grayscale and brightness in a display panel according to the present disclosure. At low grayscale, the operating temperature of the display is also low, which can be regarded as the normal operating temperature. As a result of the effect of threshold voltage Vth, the actual current detected by the first sensor unit may be different from the target brightness. Thus, to achieve the ideal display effects, adjustment is necessary to bring the current-grayscale curve (dashed lines in FIG. 11) as close to the target curve (solid line in FIG. 11) as possible. The difference in current (indicated by arrows in FIG. 11) can be used to determine the amount of adjustment to be applied to the driving voltage for driving the sub-pixels at each grayscale level, in order to obtain the target brightness. With increasing grayscale, the operating temperature of the display also increases. The second sensor unit is configured to determine the actual operating temperature, and to calculate the difference between the current-grayscale curve corresponding to the actual operating temperature and the target curve. The calculated difference can then be used to determine the amount of adjustment to be applied to the driving voltage, so as to obtain the desired display.

Figure 12:
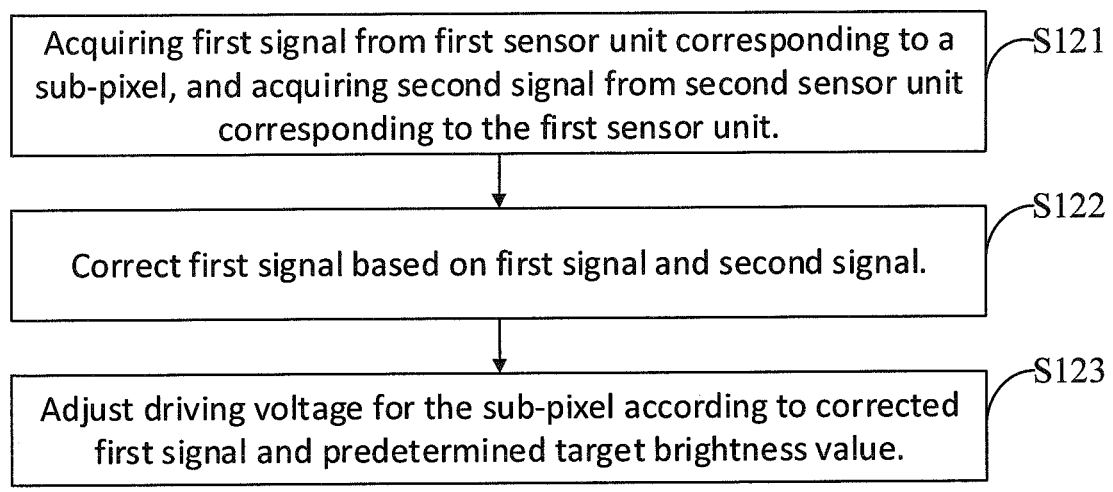
FIG. 12 shows a flow chart of a method of driving a display panel according to another embodiment of the present disclosure.

As described above, when the first sensor unit is detecting brightness of a sub-pixel, it will acquire from the sub-pixel different photocurrent values at different temperatures. The acquired photocurrent value must then be matched with a corresponding value of a particular environmental factor (for example, temperature) by the second sensor unit, in order to determine the target brightness for the sub-pixel. This processing can be complicated. FIG. 12 shows a flow chart of a method of driving a display panel according to another embodiment of the present disclosure. The driving method as illustrated in FIG. 12 makes it possible to simplify the processing of the first signals.

As shown in FIG. 12, in step 121 (S121), the first signals generated by the first photosensor S1 of the first sensor unit 2 are acquired, and the second signals generated by the second photosensor S2 of the corresponding second sensor unit 3 are acquired.

In step 122 (S122), based on the first signals and the second signals, a correction factor to be applied to the first signals is determined. The first signals are adjusted in accordance with the correction factor. More particularly, the difference, if any, between the first signals and the second signals is calculated. The calculated difference defines the correction factor, which in turn defines the amount of adjustment to be applied to the first signals.

In step 123 (S123), based on the corrected first signals and predetermined target brightness value, the driving voltage for driving the corresponding sub-pixel(s) is adjusted. More particularly, when the brightness of a sub-pixel as determined based on the corrected first signals from the corresponding first sensor unit exceeds the target brightness determined for the first sensor unit, the driving voltage for driving the sub-pixel(s) is reduced. When the brightness of the sub-pixel is less than the target brightness, the driving voltage is increased. When the brightness of the sub-pixel is equal to the target brightness, no adjustments are made to the driving voltage.

The method of driving a display panel described above may be implemented in an embodiment where one second sensor unit 3 is configured to monitor a plurality of first sensor units 2, or in an embodiment where one second sensor unit 3 is configured to monitor a single first sensor unit 2.

When the sub-pixels are being illuminated row-by-row in between displays, step 121 (S121) may be performed concurrently as the illumination of the sub-pixels to acquire first signals from the first sensor units corresponding to each sub-pixel and second signals from the second sensor units corresponding to each sub-pixel. However, the timing of step 121 (S121) is not particularly limited, and may be configured in any appropriate manner known to a person of ordinary skill in the art according to intended purposes. For example, in some embodiments, step 121 (S121) may be performed during display, rather than in between displays.

There are no particular limitations on the form of the first signals generated by the first sensor unit and the second signals generated by the second sensor unit. The first and second signals may be configured in any appropriate manner known to a person of ordinary skill in the art to encode data of interest, including, for example, a current signal, a voltage signal, or the like.

Figure 13:
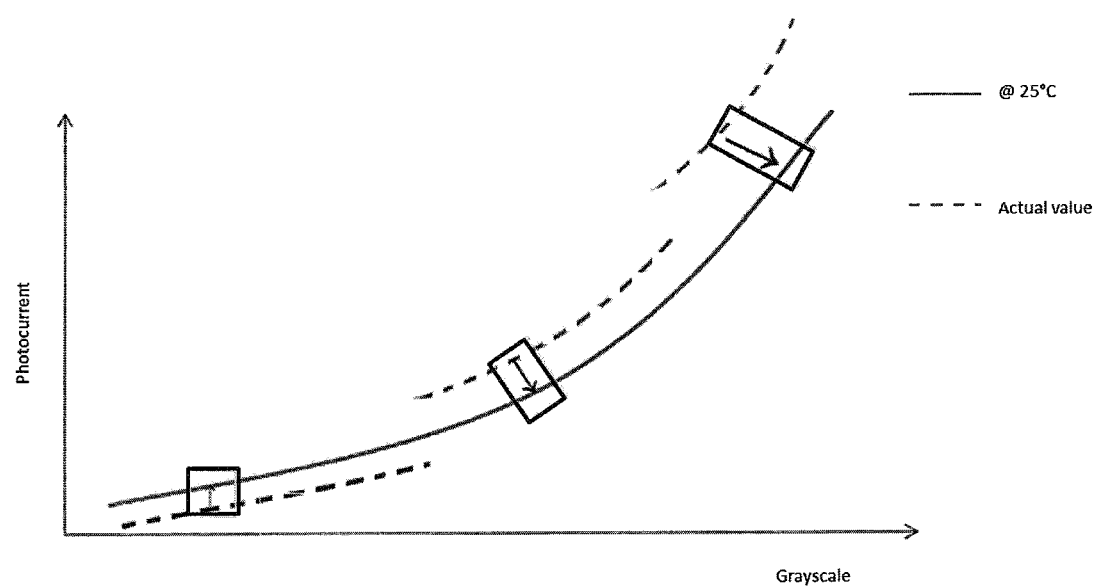
FIG. 13 shows a curve illustrating a functional relationship between grayscale and brightness in a display panel according to the embodiment illustrated in FIG. 11.

FIG. 13 shows a curve illustrating a functional relationship between grayscale and brightness in a display panel according to the present disclosure. The first sensor unit and the second sensor unit acquires input signals simultaneously, and the first and second signals generated by the first sensor unit and second sensor unit are then processed to calculate the difference, if any. The calculated difference, if any, corresponds to changes in brightness caused by changes in ambient light, since effects due to changes in other environmental variations (for example, temperature variations) are canceled out in the processing. The subsequent determination of the deviation from the target brightness involves comparing against a single curve, for example, as shown in FIG. 13. In the current-grayscale curve illustrated in FIG. 13, dashed line indicates actual photocurrent measured, and solid line indicates the target. The difference in current (indicated by arrows in FIG. 13) can be used to determine the amount of adjustment to be applied to the driving voltage for driving the sub-pixels at each grayscale level, in order to obtain the target brightness.

In the display panel according to the present disclosure, the first photosensor S1 is configured to detect the brightness of corresponding sub-pixel 1, and generate first signals corresponding to the brightness of light emitted by the sub-pixel 1. The second photosensor S2 is configured to detect variations in the external environment that are not caused by variations in ambient light, and then convert the detected variations into second signals. The second signals S2 define a correction factor to be applied to the first signals generated by the first photosensor S1, and represent the amount of deviation in the brightness as determined by the first photosensor S1 from target brightness. Based on the corrected first signals and the predetermined target brightness value, a correction factor for adjusting the driving voltage for driving the sub-pixel 1 is determined. By adjusting the driving voltage by the amount of the correction factor, the brightness of the sub-pixel 1 can be brought to the level, or substantially to the level, of the target brightness. In some embodiments, the first signals may be directly adjusted by the amount of difference between the first signals and the second signals. The correction factor for adjusting the driving voltage can then be determined based on the corrected first signals and the predetermined target brightness. The present disclosure thus makes it possible to remove interferences and distortions in the measurements of the first photosensor S1 that are caused by environmental variations, which in turn allows for the continuous and accurate monitoring and adjustment of the display by the photosensor.

It should be appreciated that changes could be made to the embodiments described above without departing from the inventive concepts thereof. It should be understood, therefore, that this invention is not limited to the particular embodiments disclosed, but it is intended to cover modifications within the spirit and scope of the present invention as defined by the appended claims.

What is claimed is:

1. A display panel, comprising:
a plurality of pixels arranged in a display array;
a plurality of first sensor units in the display array; and
a plurality of second sensor units in the display array;
wherein each pixel includes a plurality of sub-pixels, each first sensor unit is paired with each sub-pixel to detect brightness of the each sub-pixel, and each second sensor unit is paired with more than one pixel to detect a temperature variation in sub-pixels of the more than one pixel;
the each first sensor unit comprises a first switch transistor and a first photosensor, the each second sensor unit comprises a second switch transistor, a second photosensor, and a shielding layer on a light-receiving surface of the second photosensor, and the first photosensor and the second photosensor is a diode;
an area of the light-receiving surface of each second photosensor is larger than an area of a light-receiving surface of each first photosensor;
the each first sensor unit is disposed adjacent to the each sub-pixel, and the each second sensor unit is disposed between two adjacent pixels; and
the first switch transistor and the second switch transistor are configured to send out a first signal from the first photosensor and a second signal from the second photosensor simultaneously.

2. The display panel according to claim 1, wherein the each pixel includes at least one color sub-pixel and a white sub-pixel each paired with a first sensor unit.

3. The display panel according to claim 1,
wherein the each second sensor unit is further configured to convert a detected temperature variation into the second signal, and
wherein each first sensor unit is further configured to convert a detected brightness into the first signal, and to correct the first signal for the detected temperature variation based on the second signal.

4. The display panel according to claim 1, wherein the each second sensor unit is adjacent to at least one first sensor unit in the display array.

5. A display device comprising the display panel according to claim 1.

6. A method of driving the display panel according to claim 1, the method comprising:
acquiring the first signal from the first sensor unit, the first signal corresponding to the detected brightness of the at least one pixel coupled to the first sensor unit;
acquiring the second signal from the second sensor unit coupled to the first sensor unit, the second signal corresponding to the detected variation in at least one environmental parameter of the at least one of the plurality of pixels;
determining an operating target brightness for the at least one pixel based on the second signal;
adjusting a driving voltage to be applied for driving the at least one pixel in accordance with the determined operating target brightness.

7. The method according to claim 6,
wherein if the detected brightness is less than the determined operating target brightness, the driving voltage is increased;
wherein if the detected brightness is higher than the determined operating target brightness, the driving voltage is lowered; and
wherein if the detected brightness is equal to the determined operating target brightness, the driving voltage is maintained.

8. A method of driving the display panel according to claim 1, the method comprising:
acquiring the first signal from the first sensor unit, the first signal corresponding to the detected brightness of the at least one pixel coupled to the first sensor unit;
acquiring the second signal from the second sensor unit coupled to the first sensor unit, the second signal corresponding to the detected variation in at least one environmental parameter of the at least one of the plurality of pixels;
calculating a difference between the first signal and the second signal to obtain a correction factor;
correcting the first signal by the correction factor; and
adjusting a driving voltage to be applied for driving the at least one pixel in accordance with the corrected first signal and a predetermined operating target brightness for the at least one pixel.

9. The method according to claim 8,
wherein if the corrected first signal is less than the predetermined operating target brightness, the driving voltage is increased;
wherein if the corrected first signal is higher than the predetermined operating target brightness, the driving voltage is lowered; and
wherein if the corrected first signal is equal to the predetermined operating target brightness, the driving voltage is maintained.

10. The display panel according to claim 1, wherein the first photosensor and the second photosensor are connected to a fixed signal terminal and the shielding layer on the light-receiving surface of the second photosensor is connected to the fixed signal terminal.

11. A display panel, comprising:
a plurality of pixels arranged in a display array;
a plurality of first sensor units in the display array; and
a plurality of second sensor units in the display array;
wherein each pixel includes a plurality of sub-pixels, each first sensor unit is paired with the each pixel to detect brightness of sub-pixels in the each sub-pixel, and each second sensor unit is paired with more than one pixel to detect a temperature variation in sub-pixels of the more than one pixel;
the each first sensor unit comprises a first switch transistor and a first photosensor, the each second sensor unit comprises a second switch transistor, a second photosensor, and a shielding layer on a light-receiving surface of the second photosensor, and the first photosensor and the second photosensor is a diode;

an area of the light-receiving surface of each second photosensor is larger than an area of a light-receiving surface of each first photosensor;

the each first sensor unit and the each second sensor unit are disposed between two adjacent pixels; and the first switch transistor and the second switch transistor are configured to send out a first signal from the first photosensor and a second signal from the second photosensor simultaneously.

12. The display panel according to claim 11, wherein the each second sensor unit is adjacent to at least one first sensor unit in the display array.

13. The display panel according to claim 12, wherein the adjacent at least one first sensor unit are provided between adjacent rows of pixels in the display array.

* * * * *